US008493548B2

(12) United States Patent
Ivanov et al.

(10) Patent No.: US 8,493,548 B2
(45) Date of Patent: Jul. 23, 2013

(54) LITHOGRAPHIC APPARATUS AND DEVICE MANUFACTURING METHOD

(75) Inventors: Vladimir Vitalevich Ivanov, Moscow (RU); Vadim Yevgenyevich Banine, Helmond (NL); Konstantin Nikolaevich Koshelev, Troitsk (RU); Vladimir Mihailovitch Krivtsun, Troitsk (RU)

(73) Assignee: ASML Netherlands B.V., Veldhoven (NL)

( * ) Notice: Subject to any disclaimer, the term of this patent is extended or adjusted under 35 U.S.C. 154(b) by 1173 days.

(21) Appl. No.: 11/882,853

(22) Filed: Aug. 6, 2007

(65) Prior Publication Data

US 2009/0040491 A1   Feb. 12, 2009

(51) Int. Cl.
  *G03B 27/54*   (2006.01)
  *G03B 27/72*   (2006.01)
  *G03B 27/32*   (2006.01)
  *G03B 27/42*   (2006.01)

(52) U.S. Cl.
  USPC .................... 355/67; 355/53; 355/69; 355/77

(58) Field of Classification Search
  USPC ............... 355/53, 67–71, 77; 430/8, 30, 311, 430/312; 250/493.1, 492.2, 492.22, 548, 250/503.1, 504 R; 315/111.01, 111.21, 111.71; 313/231.61, 362.1
  See application file for complete search history.

(56) References Cited

U.S. PATENT DOCUMENTS

| | | | |
|---|---|---|---|
| 4,723,262 A * | 2/1988 | Noda et al. ..................... | 378/119 |
| 5,296,891 A | 3/1994 | Vogt et al. ........................ | 355/67 |
| 5,482,748 A * | 1/1996 | Soderberg et al. ............. | 427/577 |
| 5,523,193 A | 6/1996 | Nelson ........................... | 430/311 |
| 6,232,613 B1 | 5/2001 | Silfvast et al. ................. | 250/504 |
| 6,452,194 B2 * | 9/2002 | Bijkerk et al. ............. | 250/492.2 |
| 6,815,700 B2 * | 11/2004 | Melnychuk et al. ....... | 250/504 R |
| 6,972,421 B2 | 12/2005 | Melnychuk et al. | |
| 7,126,143 B2 * | 10/2006 | Klein et al. ............... | 250/504 R |
| 7,372,057 B2 * | 5/2008 | Gaebel et al. ............. | 250/504 R |
| 7,414,253 B2 | 8/2008 | Kleinschmidt et al. | |
| 7,705,331 B1 * | 4/2010 | Kirk et al. .................. | 250/493.1 |

(Continued)

FOREIGN PATENT DOCUMENTS

| | | |
|---|---|---|
| JP | 9-017595 | 1/1997 |
| JP | 2004-165155 | 6/2004 |
| JP | 2005-522839 | 7/2005 |
| JP | 2007-087939 | 4/2007 |
| WO | WO 98/33096 | 7/1998 |
| WO | WO 98/38597 A2 | 9/1998 |
| WO | WO 98/38597 A3 | 9/1998 |

OTHER PUBLICATIONS

Japanese Office Action mailed Mar. 4, 2013 in corresponding Japanese Patent Application No. 2010-519881.

*Primary Examiner* — Toan Ton
*Assistant Examiner* — Christina Riddle
(74) *Attorney, Agent, or Firm* — Pillsbury Winthrop Shaw Pittman LLP

(57) ABSTRACT

A lithographic system includes a source configured to generate a radiation, the source including a cathode and an anode, the cathode and the anode configured to create a discharge in a fuel located in a discharge space so as to generate a plasma, the discharge space including, in use, a substance configured to adjust radiation emission by the plasma so as to control a volume defined by the plasma; a pattern support configured to hold a patterning device, the patterning device configured to pattern the radiation to form a patterned beam of radiation; a substrate support configured to support a substrate; and a projection system configured to project the patterned beam of radiation onto the substrate.

39 Claims, 5 Drawing Sheets

U.S. PATENT DOCUMENTS

| | | |
|---|---|---|
| 2004/0105082 A1* | 6/2004 | Koshelev et al. ............... 355/53 |
| 2004/0108473 A1 | 6/2004 | Melnychuk et al. |
| 2004/0141165 A1* | 7/2004 | Zukavishvili et al. .......... 355/53 |
| 2004/0231797 A1* | 11/2004 | Jeon et al. ................ 156/345.26 |
| 2004/0256575 A1* | 12/2004 | Singer et al. ............... 250/492.2 |
| 2006/0066197 A1* | 3/2006 | Stivers ..................... 313/231.31 |
| 2006/0138960 A1* | 6/2006 | Derra et al. .................... 313/618 |
| 2007/0045573 A1 | 3/2007 | Kleinschmidt et al. |
| 2007/0069159 A1* | 3/2007 | Banine et al. .............. 250/493.1 |
| 2008/0048134 A1* | 2/2008 | Shirai et al. ............... 250/504 R |
| 2008/0311009 A1* | 12/2008 | Hirata et al. .................. 422/171 |

* cited by examiner

LITHOGRAPHIC APPARATUS AND DEVICE MANUFACTURING METHOD

BACKGROUND

1. Field

The present invention relates to a lithographic apparatus and methods.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

Photolithography is widely recognized as one of the key steps in the manufacture of ICs and other devices and/or structures. At present, no alternative technology seems to provide the desired pattern architecture with similar accuracy, speed, and economic productivity. However, as the dimensions of features made using photolithography become smaller, photolithography is becoming one of the most, if not the most, critical gating factors for enabling miniature IC or other devices and/or structures to be manufactured on a truly massive scale.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature.

It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to significantly shorten the exposure wavelength and, thus, reduce the minimum printable pitch, it has been proposed to use an extreme ultraviolet (EUV) radiation source. In contrast to conventional ultraviolet radiation sources, which are configured to output a radiation wavelength greater than about 193 nm, EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

The power radiated by an EUV radiation source depends on the source size. Generally, it is desirable to collect as much power radiated by the source as possible because a large collection efficiency of the radiated power means that the power provided to the source can be reduced, which will be beneficial to the lifetime of the source. The source size together with the collection angle form the etendue of the source. Only radiation emitted within the etendue of the source may be taken into account and used for illuminating the patterning device.

SUMMARY

In an aspect of the invention, there is provided a method for generating a radiation for use in a lithographic apparatus, the method including supplying a fuel to a discharge space located between a cathode and an anode; creating a discharge between the cathode and the anode in the fuel to form a plasma; and adjusting a volume defined by the plasma by controlling radiation emission by the plasma, the adjusting including supplying a substance to the plasma to control the radiation emission.

In an aspect of the invention, there is provided a device manufacturing method including generating a beam of radiation, the generating including supplying a fuel to a discharge space located between a cathode and an anode; creating a discharge between the cathode and the anode in the fuel to form a plasma; and adjusting a volume defined by the plasma by controlling radiation emission by the plasma, the adjusting including supplying a substance to the plasma to control the radiation emission; patterning the beam of radiation to form a patterned beam of radiation; and projecting the patterned beam of radiation onto a substrate.

In an aspect of the invention, there is provided a source configured to generate a radiation for a lithographic apparatus, the source including a cathode and an anode, the cathode and the anode configured to create a discharge in a fuel located in a discharge space so as to generate a plasma, the discharge space including, in use, a substance configured to adjust radiation emission by the plasma so as to control a volume defined by the plasma.

In an aspect of the invention, there is provided a lithographic system including a source configured to generate a radiation, the source comprising a cathode and an anode, the cathode and the anode configured to create a discharge in a fuel located in a discharge space so as to generate a plasma, the discharge space including, in use, a substance configured to adjust radiation emission by the plasma so as to control a volume defined by the plasma; a pattern support configured to hold a patterning device, the patterning device configured to pattern the radiation to form a patterned beam of radiation; a substrate support configured to support a substrate; and a projection system configured to project the patterned beam of radiation onto the substrate.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
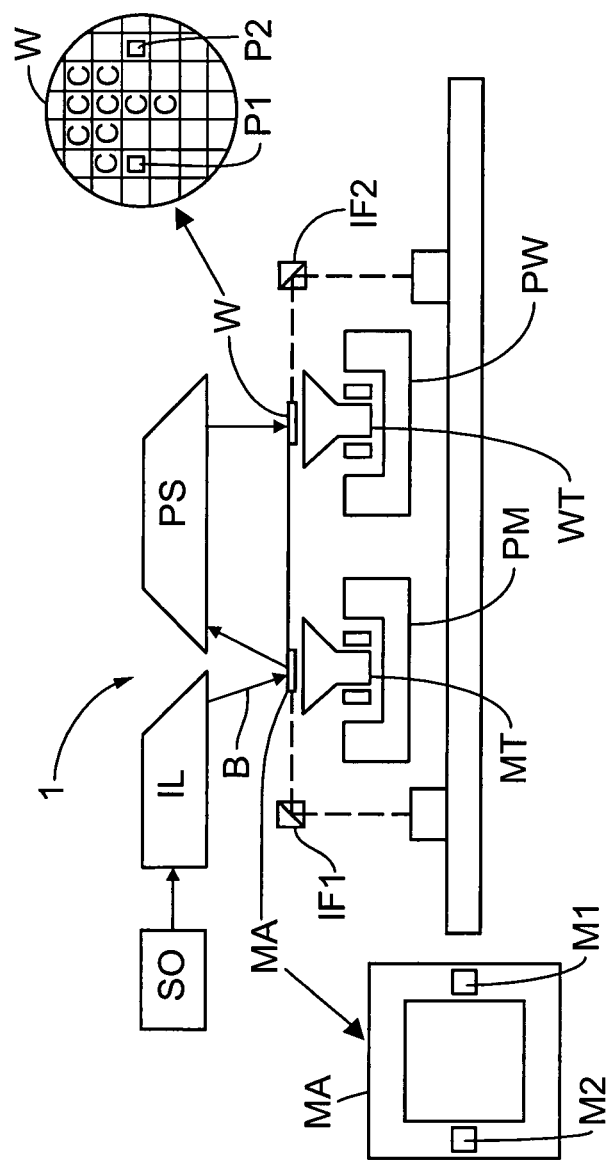
FIG. 1 schematically depicts a lithographic apparatus according to an embodiment of the present invention.

FIG. 1 schematically depicts a lithographic apparatus 1 according to an embodiment of the present invention. The apparatus 1 includes a source SO configured to generate radiation, an illumination system (illuminator) IL configured to condition a radiation beam B (e.g. EUV radiation) from the radiation received from source SO. The source SO may be provided as a separate unit. A support or pattern support (e.g. a mask table) MT is configured to support a patterning device (e.g. a mask) MA and is connected to a first positioning device PM configured to accurately position the patterning device MA in accordance with certain parameters. A substrate table or substrate support (e.g. a wafer table) WT is configured to hold a substrate (e.g. a resist-coated wafer) W and is connected to a second positioning device PW configured to accurately position the substrate W in accordance with certain parameters. A projection system (e.g. a refractive projection lens system) PS is configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system (not shown in FIG. 1) if required, may be referred to as a radiation system.

The illuminator IL may include an adjusting device configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser (not shown in FIG. 1). The illuminator may be used to condition the radiation beam, to have a desired uniformity and intensity distribution in its cross-section.

The radiation beam B is incident on the patterning device (e.g., mask) MA, which is held on the support (e.g., mask table) MT, and is patterned by the patterning device. After being reflected by the patterning device MA, the radiation beam B passes through the projection system PS, which projects the beam onto a target portion C of the substrate W. With the aid of the second positioning device PW and position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the patterning device MA with respect to the path of the radiation beam B, e.g. after mechanical retrieval from a mask library, or during a scan. In general, movement of the support MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the mask alignment marks may be located between the dies.

The depicted apparatus could be used in at least one of the following modes:

In step mode, the support MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

In scan mode, the support MT and the substrate table WT are scanned synchronously while a pattern imparted to the radiation beam is projected onto a target portion C (i.e. a single dynamic exposure). The velocity and direction of the substrate table WT relative to the support MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the support MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
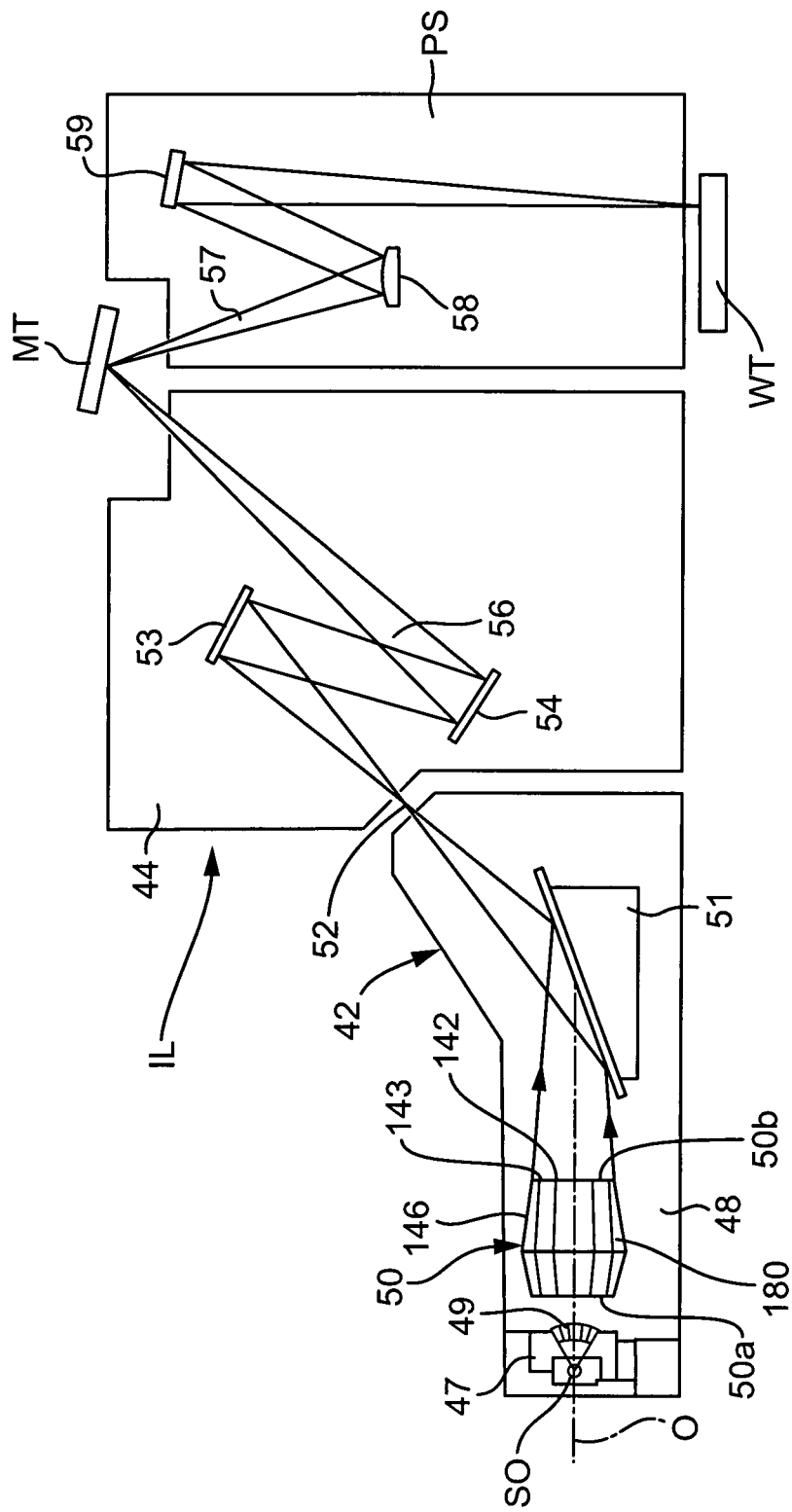
FIG. 2 schematically depicts a side view of an EUV illumination system and projection optics of a lithographic projection apparatus according to FIG. 1.

FIG. 2 shows the projection apparatus 1 in more detail, including a radiation system 42, an illumination optics unit 44, and the projection system PS. The radiation system 42 includes the radiation source SO which may be formed by a discharge plasma. EUV radiation may be produced by a gas or vapor, for example Xe gas, Li vapor or Sn vapor in which a very hot plasma is created to emit radiation in the EUV range of the electromagnetic spectrum. The very hot plasma is created by causing an at least partially ionized plasma by, for example, an electrical discharge. Partial pressures of, for example, 10 Pa of Xe, Li, Sn vapor or any other suitable gas or vapor may be required for efficient generation of the radiation. The radiation emitted by radiation source SO is passed from a source chamber 47 into a collector chamber 48 via a gas barrier or contaminant trap 49 which is positioned in or behind an opening in source chamber 47. The contaminant trap 49 may include a channel structure. Contamination trap 49 may also include a gas barrier or a combination of a gas barrier and a channel structure. In an embodiment, as discussed in FIG. 3, a Sn source is applied as an EUV source.

The collector chamber 48 includes a radiation collector 50 which may be formed by a grazing incidence collector. Radiation collector 50 has an upstream radiation collector side 50a and a downstream radiation collector side 50b. Radiation collector 50 includes various reflectors, e.g. reflectors 142, 143 and outer reflector 146, as shown in FIG. 2. Radiation passed by collector 50 can be reflected off a grating spectral filter 51 to be focused in a virtual source point 52 at an aperture in the collector chamber 48. From collector chamber 48, a beam of radiation 56 is reflected in illumination optics unit 44 via normal incidence reflectors 53, 54 onto the patterning device MA positioned on the support MT. A patterned beam 57 is formed which is imaged in projection system PS via reflective elements 58, 59 onto wafer stage or substrate table WT. More elements than shown may generally be present in illumination optics unit 44 and projection system PS. Grating spectral filter 51 may optionally be present, depending upon the type of lithographic apparatus. Further, there may be more mirrors present than those shown in FIG. 2, for example there may be 1-4 more reflective elements present than 58, 59.

It should be appreciated that radiation collector 50 may have further features on the external surface of outer reflector 146 or further features around outer reflector 146, for example a protective holder, a heater, etc. Reference number 180 indicates a space between two reflectors, e.g. between reflectors 142 and 143. Each reflector 142, 143, 146 may include at least two adjacent reflecting surfaces, the reflecting surfaces further from the source SO being placed at smaller angles to the optical axis O than the reflecting surface that is closer to the source SO. In this way, a grazing incidence collector 50 is configured to generate a beam of EUV radiation propagating along the optical axis O.

Instead of using a grazing incidence mirror as collector mirror 50, a normal incidence collector may be applied. Collector mirror 50, as described herein in an embodiment in more detail as nested collector with reflectors 142, 143, and 146, and as schematically depicted in, amongst others, FIG. 2, is herein further used as example of a collector (or collector mirror). Hence, where applicable, collector mirror 50 as grazing incidence collector may also be interpreted as collector in general and in a specific embodiment also as normal incidence collector.

Further, instead of a grating 51, as schematically depicted in FIG. 2, a transmissive optical filter may be applied. Optical filters transmissive for EUV and less transmissive for or even substantially absorbing UV radiation are known in the art. Hence, "grating spectral purity filter" is herein further indicated as "spectral purity filter," which includes gratings or transmissive filters. Not depicted in FIG. 2, but also included as optional optical element may be EUV transmissive optical filters, for instance arranged upstream of collector mirror 50, or optical EUV transmissive filters in illumination unit 44 and/or projection system PS.

In the embodiment of the FIGS. 1 and 2, the lithographic apparatus 1 is a maskless lithographic apparatus in which the patterning device MA is a programmable mirror array. One example of such an array is a matrix-addressable surface having a viscoelastic control layer and a reflective surface. The basic principle behind such an apparatus is that, for example, addressed areas of the reflective surface reflect incident radiation as diffracted radiation, whereas unaddressed areas reflect incident radiation as undiffracted radiation. Using an appropriate filter, the undiffracted radiation can be filtered out of the reflected beam, leaving only the diffracted radiation behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT Publication Nos. WO 98/38597 and WO 98/33096. In the case of a programmable mirror array, the support structure may be embodied as a frame or table, for example, which may be fixed or movable as required.

The size(s) of the mirrors in a programmable mirror array is/are generally larger than the critical dimension of a pattern present on a conventional (reflective or transmissive) mask. As such, a maskless lithographic apparatus generally requires a projection lens that has a higher de-multiplication factor than that of a non-maskless lithographic apparatus. For example, the de-multiplication factor of maskless lithographic apparatus is about 100, whereas the de-multiplication factor of non-maskless lithographic apparatus is about 4. Therefore, for a given numerical aperture of the projection system, the patterned radiation beam collected by the projection system PS in a maskless lithographic apparatus is much smaller than that of a lithographic apparatus using a conventional (reflective or transmissive) mask. This, in turn, limits the etendue of the maskless lithographic apparatus.

It follows that existing EUV sources that are developed for conventional patterning device applications may have a source etendue that is significantly larger than that of a maskless lithographic apparatus. If the etendue of the source is larger than the etendue of the lithographic apparatus, radiation may be lost. In order to compensate for the loss of radiation, exposure time of the substrate may be increased. However, this may affect substrate throughput.

Due to the small etendue of a maskless apparatus, it is therefore desirable that all the radiations emitted by the radiation source SO be collected by the lithographic apparatus I to limit radiation loss. In order to ensure that substantially all the radiations emitted by the source SO illuminate the patterning device MA and are collected by the projection system PS, it is desirable to match the etendue of the source SO with that of the lithographic apparatus 1. For example, in the embodiments of FIGS. 1 and 2, it is desirable to limit the etendue of the source in a range lower than about 0.03 mm$^2$ steradian.

Figure 3:
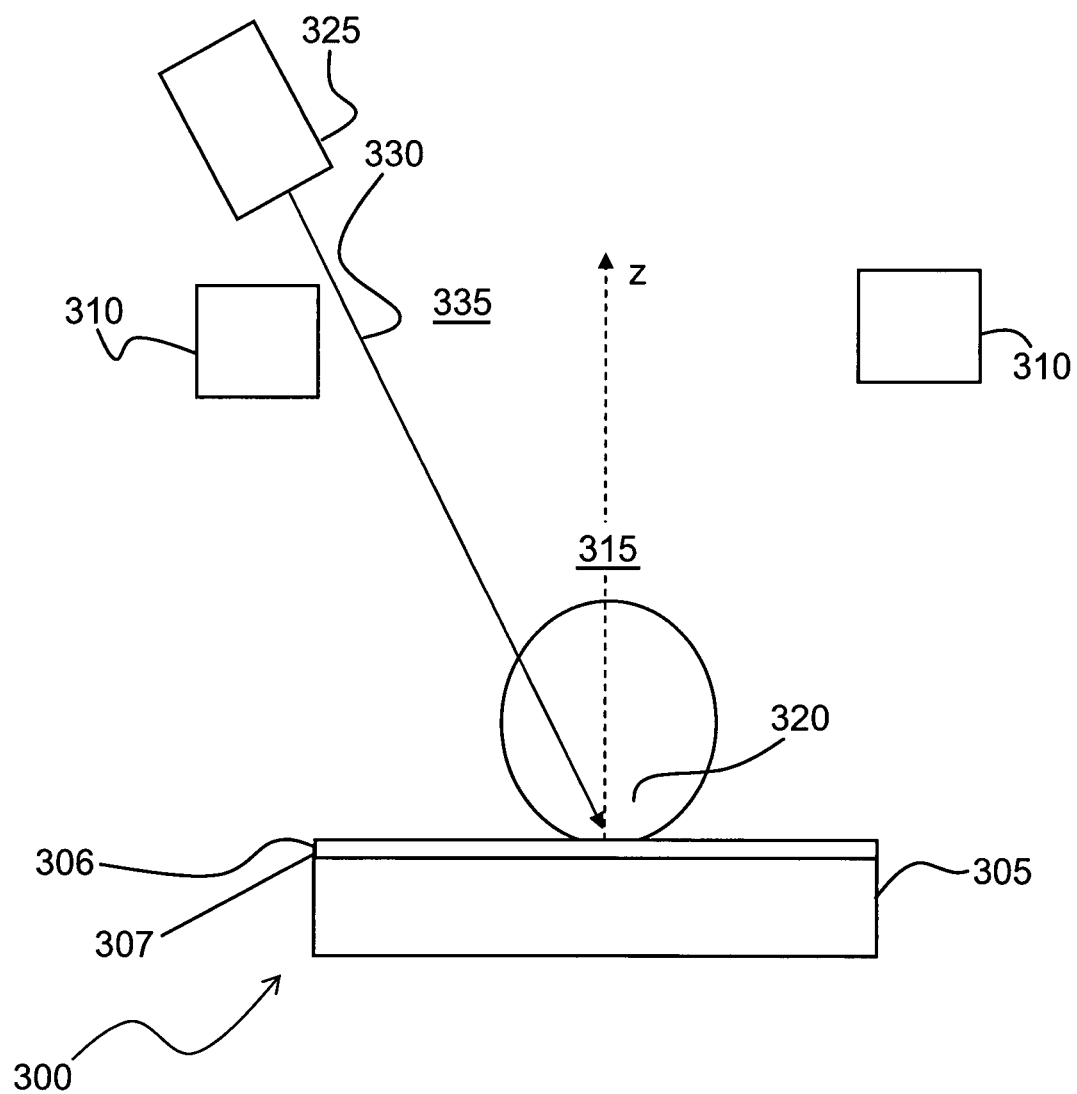
FIG. 3 shows a schematic representation of an EUV source in accordance with an embodiment of the invention.

FIG. 3 shows a plasma source 300 for use in the lithographic apparatus of FIGS. 1 and 2 in accordance with an embodiment of the invention. The effective radial and/or axial size of the plasma influences the etendue of the source. In order to adjust (e.g. reduce) the etendue of the plasma source 300, thereby matching the etendue of the source with the etendue of the lithographic apparatus 1, the source 300 is constructed and arranged such that the radial and/or axial size of the plasma is controlled, e.g. reduced, during the discharge.

As shown in FIG. 3, plasma source 300 includes a cathode 305, an anode 310 and a discharge space 315 located between the anode and the cathode. The cathode and anode 305, 310 each have a generally cylindrical shape that is substantially centered on a common z-axis. In FIG. 3, the z-axis is referred to as the discharge axis.

In operation, a high temperature discharge plasma may be generated by applying a discharge in a fuel between the cathode 305 and the anode 310. The fuel being used to generate the plasma is located in the discharge space 315. The fuel may be solid, liquid or gaseous. For example, in the implementation of FIG. 3, the fuel may consist of a thin layer of tin (Sn) 306 located on the upper portion 307 of the cathode 305. In another implementation, the fuel may include a gas such as Xe. In yet another implementation, different materials such as lithium or indium may be used as fuel material. Ignition of the plasma discharge may be performed with a laser source 325, as shown in FIG. 3. The radiation beam 330 outputted by the laser source 325 is focused onto the upper portion 307 of the cathode 305 through the opening 335. Due to the absorption of the laser energy in the thin layer 306, Sn is evaporated and partly ionized.

The plasma 320 expands during the discharge between the cathode 305 and the anode 310 along a path defined by the fuel material and the electric field existing between the cathode and the anode. Specifically, about 30-100 nanoseconds after laser ablation, the fuel vapor expands and reaches the edge of the anode 310 forming a conducting path between the cathode 305 and the anode 310. Once the conducting path is formed, the discharge between the anode 305 and the cathode 310 is triggered, thereby causing further ionizations and heating within the plasma 320.

After ignition, the plasma 320 is sustained by Ohmic heating in which further ionizations are created within the plasma due to the magnetic field generated by the current flowing between the cathode 305 and the anode 310. The magnetic field causes a Lorentz force to act on the particles of the plasma 320, thereby creating collisions and ionizations of the particles. The size of the plasma 320 is balanced at equilibrium by two opposite forces: the thermal pressure within the plasma and the magnetic pressure acting on the plasma. The magnetic pressure is proportional to $I^2$, where I is the discharge current. As the discharge current I increases, the magnetic pressure is increased relative to the thermal pressure. In doing so, the pressure balance is disrupted and the plasma 320 tends to compress in the radial direction (i.e. perpendicular to the z-axis or discharge axis). This process may be referred to as the pinch effect, which leads to the formation of a high density and temperature plasma column that emits EUV radiation. Due to instability, this plasma column is usually broken into a plurality of elementary plasma columns or elementary EUV sources.

In effect, the plasma 320, also referred to hereinafter as the plasma pinch, includes a plurality of elementary sources, which are located along the discharge axis. These elementary sources may also be termed hot spots or EUV radiating points (ERP). The characteristics of these elementary sources may depend upon, for example, the fuel being used to create the plasma (Sn, In, Xe, . . . ), the geometry of the source (e.g., size of the cathode and anode, distance between the cathode and anode) and the power supplied to the source. The radial and axial sizes of the EUV radiating points may be proportional to each other. For example, if the plasma fuel consists of tin (Sn), the radial and axial sizes of the EUV radiating points may be about 0.02 cm and 0.05 cm, respectively.

It will be appreciated that the final radial size $r_p$ of these EUV sources is defined by the radiation properties of the plasma. In essence, the Ohmic heating and radiation power of a transparent plasma are proportional to $1/r_p^2$ while the radiation power of an optically thick plasma is proportional to $r_p$, where $r_p$ is the radius of the pinch column. Radiation power may be defined as the energy losses from the plasma due to line radiation. The term "transparent plasma" means that the mean free path of photons burned in the plasma is much larger than the characteristic size of the plasma (i.e., the photons easily escape from the plasma). The term "optically thick plasma" refers to the situation in which the mean free path of photons burned in the plasma is much smaller than the characteristic size of the plasma.

If at some point in time, the radiation power is larger than the power gained by Ohmic heating, the plasma will then shrink to return to a balance between the Ohmic heating and the radiation power. During this process, the plasma becomes optically thick since its density ($\sim 1/r_p^2$) increases faster than its radius. Shrinkage of an optically thick plasma leads to the reduction of radiation power while the power gained by Ohmic heating increases. Shrinkage of the plasma is stopped when these two powers are equal. This process may be referred to as "radiation collapse" of the z-pinch.

Reduction of the radial and/or axial size of the plasma pinch 300 may increase the amount of radiation collected by the lithographic apparatus. For example, as shown in FIG. 3, reduction of the radial size of the plasma pinch 300, i.e. reduction of the plasma pinch 300 in a direction substantially perpendicular to the z-axis, may reduce the amount of radiation blocked by the anode 310 and/or by any other elements that may be located proximate the z-axis. As there is less radiation blocked by the anode 310, the power provided to the source can be reduced, which is beneficial to the lifetime of the source.

In order to control, e.g. reduce, the radial and/or axial size of the plasma 320, the plasma source 300 is constructed and arranged to increase radiation losses or radiation emission (i.e. radiation power is increased) by the plasma 320. For example, Sn and In plasmas radiate at different wavelengths. As a result, radiation losses of a transparent Sn and In mixture are larger than in a transparent Sn plasma. This means, in turn, that the plasma column may be shrunk to smaller radii in order to establish equality between Ohmic heating and radiation power.

In the embodiment of FIG. 3, radiation losses are increased in the plasma 320 by adding one or more substance(s), admixture(s) or element(s) to the fuel. The substance(s), admixture(s) or element(s) is/are added to the fuel for its/their aptitude to increase radiation losses or emissions within a desired or pre-determined wavelength range or spectrum. In this context, the language "desired or pre-determined wavelength range or spectrum" means a wider spectrum range, also referred to as "out of band EUV radiation" range, than the one used for EUV lithography, also referred to as "in band radiation" range. For example, the optimal electron temperature $T_e$ of an EUV plasma source at 13.5 nm is about 30-50 eV. At this electron temperature $T_e$, plasma may, in principle, emit effectively at photon energies in the range between about 0.5-5 $kT_e$, which means that "out of band EUV" wavelength range is about 5-100 nm. Adding elements, which may effectively radiate in this region, may increase radiation losses of plasma. For example, in one embodiment, low melting point elements such as gallium (Ga), indium (In), bismuth (Bi), aluminum (Al) or lead (Pb) may be used to increase radiation losses within the plasma pinch 320.

The choice of the substance(s), admixture(s) or element(s) may be based upon the nature of the fuel being used to generate the plasma 320. In particular, selection of the substance(s), admixture(s) or element(s) may be based upon a wavelength range or spectrum for the fuel under consideration in which radiation losses predominantly influence the emitting size or surface of the plasma. For example, in the case of tin (Sn), only a small part of the spectrum (from about 13.0 nm to about 14.0 nm) is dominated by radiation losses. If one increases radiation losses or radiation emission in the plasma pinch in the wavelength range belonging to the 5-100 nm range, one may disrupt the equilibrium and control, e.g. decrease, the radial and/or axial size of the plasma pinch.

Thus, in one embodiment of the invention, control, e.g. reduction, of the radial and/or axial size of the plasma pinch may be performed in accordance with the following method. First, a fuel is selected for its aptitude to provide in band EUV radiations. The method then proceeds to a second procedure in which a substance(s) that is/are adapted to produce radiation emission in the out of band EUV range is selected. After the second procedure, the substance is added to the fuel to control, e.g. reduce, the radial and/or axial size of the plasma pinch.

In addition to controlling, e.g. decreasing, the radial and/or axial size of the plasma pinch 320, the substance(s), admixture(s) or element(s) may significantly reduce the operating temperature of the plasma source, which may also beneficially prolong the lifetime of the source. For example, a source including a fuel mixture of Sn and In will have an operating temperature of about 250° C., whereas a conventional source including only Sn will have an operating temperature of about 300° C. Similarly, a source including a fuel mixture of Sn and Ga will have an operating temperature of about 20° C.-25° C. (i.e. room temperature). As another example, a source including a fuel mixture of Sn and Al will have an operating temperature of about 500° C.

In an embodiment, the substance(s), admixture(s) or element(s) may be mixed with the fuel before the fuel is introduced into the discharge space 315. For example, in the embodiment of FIG. 3, the fuel may be part of the thin layer 306. In this configuration, the thin layer 306 may be solid or liquid. As another example, the substance(s), admixture(s) or element(s) may be added to a liquid fuel supply as shown in FIG. 4.

Figure 4:
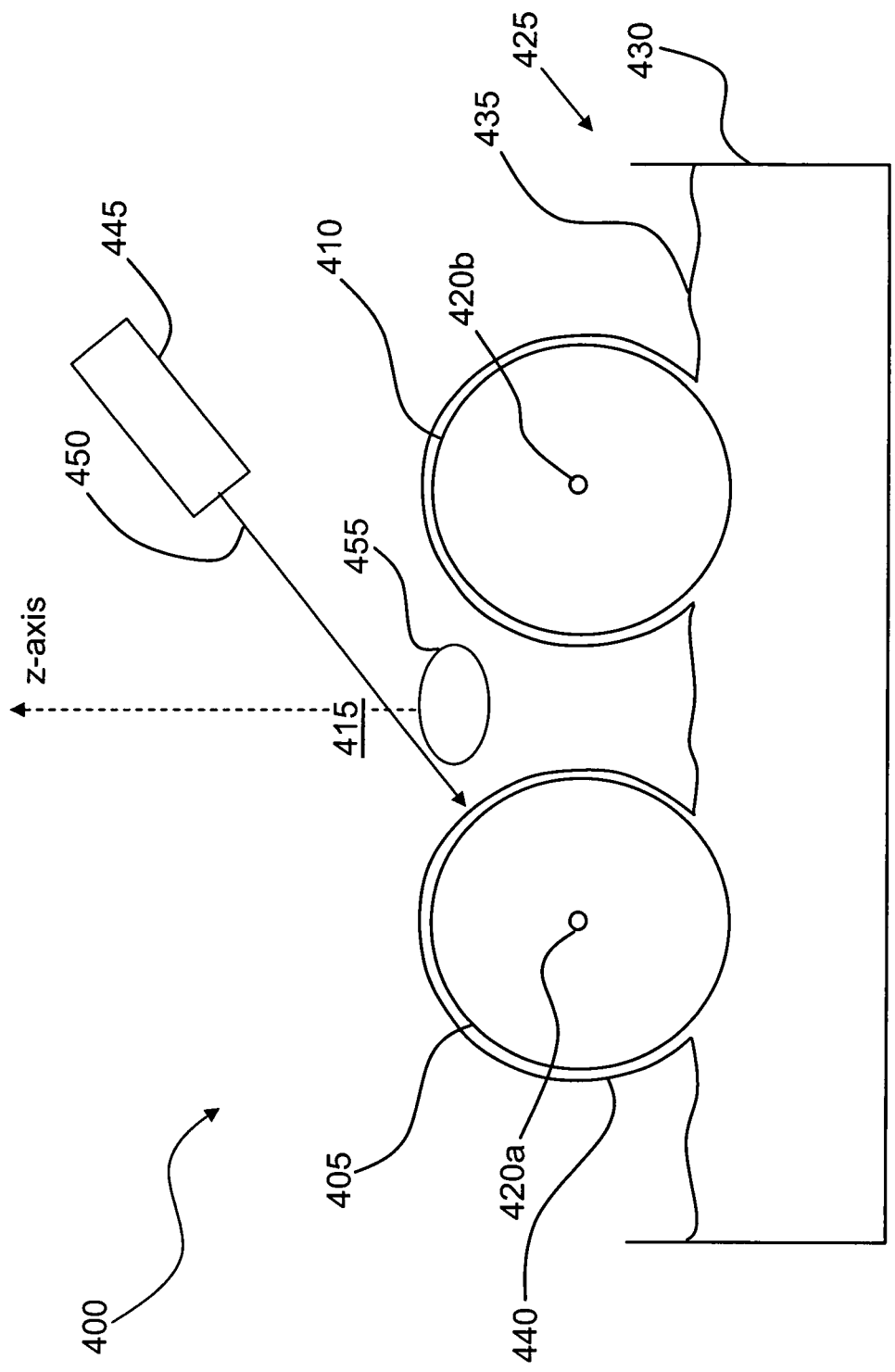
FIG. 4 shows a schematic representation of an EUV source in accordance with an embodiment of the invention.

FIG. 4 shows a source 400 in accordance with an embodiment of the invention. Source 400 includes a cathode 405, an anode 410 and a discharge space 415, which is located between the cathode 405 and the anode 410. The cathode 405 and the anode 410 may have a cylindrical shape and may each be rotatably mounted on respective shafts 420a, b. The shafts 420a, b are driven by a driving unit (not shown in FIG. 4) to rotate the cathode 405 and the anode 410.

As shown in FIG. 4, the source 400 also includes a fuel supply 425 that is constructed and arranged to supply a fuel 435 to the cathode 405. The fuel supply 425 includes a container 430 that contains the fuel 435. The source 400 further includes a laser source 445 that is configured to output a radiation beam 450. In operation, a layer or coating 440 of fuel 435 is formed on the outer surface of the cathode 405 due to the rotation of the cathode 405. The fuel coating 440 formed on the cathode 405 and the anode 410 also serves to maintain a cooling and/or protective layer for cooling and/or protecting the cathode 405 and the anode 410. The rotation speed of the cathode 405 and the anode 410 may be adjusted based upon the desired thickness of the coating 440.

Ignition of the plasma discharge is performed with the laser source 445 in a similar manner as in the embodiment of FIG. 3. Specifically, the radiation beam 445 outputted by the laser source 445 is focused onto the coating 440. Due to the absorption of the laser energy in the coating, the fuel 435 is evaporated and partly ionized, which forms a plasma 455. The plasma 455 expands during the discharge between the cathode 405 and the anode 410 along a path defined by the electric field between the cathode and the anode and the fuel material.

Control of the size or volume of the plasma 455 is effected in the embodiment of FIG. 4 by adding one or more substance(s), admixture(s) or element(s), to the fuel supply 425 such that a portion of the coating 440 to be ionized by the radiation beam 450 includes a substantially homogeneous mixture of the fuel 435 and the substance(s), admixture(s) or element(s). The ionized homogeneous mixture of the fuel 435 and the substance(s), admixture(s) or element(s) propagates between the cathode 405 and the anode 410 such that the size or volume of the plasma 455 can be substantially controlled during the plasma discharge.

Alternatively, the substance(s), admixture(s) or element(s) may be added to the fuel at the time, or after, the fuel is introduced into the discharge space 415. In addition, the substance(s), admixture(s) or element(s) may be added to the fuel supply before or after ignition of the plasma. Furthermore, control, e.g. reduction, of the volume defined by the plasma may be done by adjusting the concentration of the admixture in the fuel supply.

Figure 5:
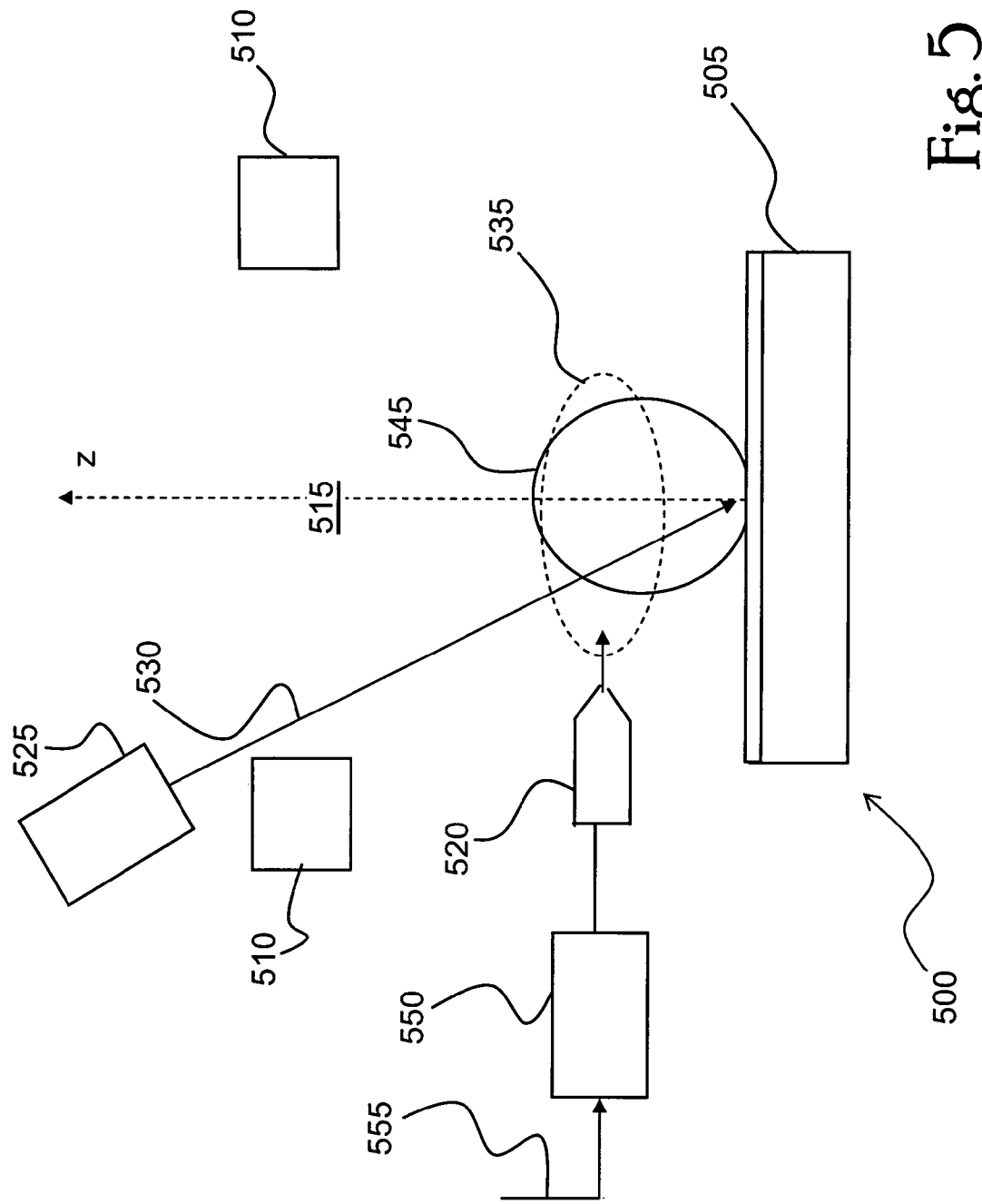
FIG. 5 shows a schematic representation of an EUV source in accordance with an embodiment of the invention.

FIG. 5 shows a plasma source 500 for use in the lithographic apparatus of FIGS. 1 and 2 in accordance with an embodiment of the invention. Source 500 includes a cathode 505, an anode 510 and a discharge space 515 located between the anode and the cathode. The source also includes a laser source 525 configured to output a radiation beam 530. The cathode and anode 505, 510 each have a generally cylindrical shape that is substantially centered on a common z-axis. In FIG. 5, the z-axis is referred to as the discharge axis. Similarly to FIG. 3, the fuel may be provided on top of the cathode 505. Alternatively, the fuel may be a gas introduced into the discharge space 515 through a supply nozzle (not shown in FIG. 5).

The source 500 also includes a supply unit 520 configured to supply the substance(s), admixture(s) or element(s) 535 into the discharge space 515. The substance(s), admixture(s) or element(s) 535 may be introduced into the discharge space 515 in various forms, e.g., gas, liquid or solid.

In the embodiments of FIGS. 3-5, concentration and/or pressure of the substance(s), admixture(s) or element(s) may be determined and adjusted based upon the desired radial and/or axial size of the plasma pinch 545. This concentration may be determined by calibration, as will be appreciated by one of ordinary skill in the art. Alternatively, the concentration and/or pressure of the admixture(s) or element(s) may be dynamically modified in order to adjust the radial and/or axial size of the plasma pinch. For example, in one embodiment, the supply unit 520 may be in communication with a controller 550 to adjust the concentration and/or pressure of the admixture(s) or element(s). The controller 550 may be operatively connected to a monitoring unit (e.g., a camera, not shown in FIG. 5) configured to monitor the plasma pinch 545 during the discharge. The monitoring unit may be used to determine the size (axial and/or radial) of the plasma pinch. Based on the results of the monitoring unit, a command 555 may be inputted to the controller 550 to adjust the initial concentration and/or pressure of the substance(s), admixture(s) or element(s) in order to modify, e.g. decrease or increase, the radial and/or axial size of the plasma pinch 545.

Although specific reference may be made in this text to the use of lithographic apparatus in the manufacture of ICs, it should be appreciated that the lithographic apparatus described herein may have other applications, such as the manufacture of integrated optical systems, guidance and detection patterns for magnetic domain memories, flat-panel displays, flat panel displays including liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications and where the context allows, is not limited to optical lithography.

While specific embodiments of the present invention have been described above, it should be appreciated that embodiments of the present invention may be practiced otherwise than as described. For example, an embodiment of the present invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the present invention as described without departing from the scope of the claims set out below.

Embodiments of the present invention are not limited to applications of the lithographic apparatus or use in the lithographic apparatus. Further, the drawings usually only include the elements and features that are necessary to understand embodiments of the present invention. Beyond that, the drawings of the lithographic apparatus are schematic and not on scale. Embodiments of the present invention are not limited to those elements, shown in the schematic drawings (e.g. the number of mirrors drawn in the schematic drawings). Further, embodiments of the present invention are not confined to the lithographic apparatus described in relation to FIGS. 1 and 2.

What is claimed is:

1. A method for generating a radiation for use in a lithographic apparatus, the method comprising:
   supplying a fuel to a discharge space located between a cathode and an anode;
   creating a discharge between the cathode and the anode in the fuel to form a plasma; and reducing a volume defined by the plasma by controlling radiation emission by the plasma, the reducing including supplying a substance to the plasma to control the radiation emission, wherein the substance includes at least one of Ga, In, Bi, Pb or Al.

2. The method of claim 1, wherein the fuel includes at least one of Sn, Xe or Li.

3. The method of claim 1, wherein the substance and the fuel are separately supplied to the discharge space.

4. The method of claim 1, wherein the substance is part of a mixture including the fuel.

5. The method of claim 4, wherein the mixture is solid or liquid.

6. The method of claim 5, further comprising supplying the mixture to the cathode before creating the discharge.

7. The method of claim 1, wherein the substance is selected to increase radiation emission in a pre-determined wavelength range.

8. The method of claim 1, wherein the reducing the volume defined by the plasma includes reducing a radial size of the plasma.

9. The method of claim 1, wherein the reducing includes controlling the volume defined by the plasma such that an etendue of a radiation source configured to generate the plasma substantially matches an etendue of the lithographic apparatus.

10. A device manufacturing method comprising:
generating a beam of radiation, the generating including
supplying a fuel to a discharge space located between a cathode and an anode;
creating a discharge between the cathode and the anode in the fuel to form a plasma; and
reducing a volume defined by the plasma by controlling radiation emission by the plasma, the reducing including supplying a substance to the plasma to control the radiation emission, wherein the substance includes at least one of Ga, In, Bi, Pb or Al;
patterning the beam of radiation to form a patterned beam of radiation; and
projecting the patterned beam of radiation onto a substrate.

11. The method of claim 10, wherein the fuel includes at least one of Sn, Xe or Li.

12. The method of claim 10, wherein the substance and the fuel are separately supplied to the discharge space.

13. The method of claim 10, wherein the substance is selected to increase radiation emission in a pre-determined wavelength range.

14. The method of claim 10, wherein the reducing the volume defined by the plasma is such that an etendue of a radiation source configured to generate the plasma substantially matches an etendue of a lithographic apparatus configured to pattern the beam of radiation.

15. A source configured to generate a radiation for a lithographic apparatus, the source comprising:
a cathode and an anode, the cathode and the anode configured to create a discharge in a fuel located in a discharge space so as to generate a plasma, the discharge space including, in use, a substance configured to adjust radiation emission by the plasma so as to reduce a volume defined by the plasma, wherein the substance includes at least one of Ga, In, Bi or Al.

16. The source of claim 15, wherein the fuel includes at least one of Sn, Xe or Li.

17. The source of claim 15, further comprising a fuel supply configured to supply the fuel to the discharge space.

18. The source of claim 15, further comprising a supply configured to supply the substance in the discharge space.

19. The source of claim 18, wherein the substance and the fuel are separately supplied to the discharge space.

20. The source of claim 15, wherein the substance is part of a mixture including the fuel.

21. The source of claim 20, wherein the mixture is solid or liquid.

22. The source of claim 21, wherein the mixture is located on the cathode.

23. The source of claim 15, wherein the substance is selected to increase the radiation emission in a pre-determined wavelength range.

24. The source of claim 15, wherein the substance is configured to reduce a radial size of the plasma.

25. The source of claim 15, further comprising a supply configured to supply both the fuel and the substance in the discharge space.

26. The source of claim 15, wherein an etendue of the source substantially matches an etendue of the lithographic apparatus.

27. A lithographic system comprising:
a source configured to generate a radiation, the source comprising a cathode and an anode, the cathode and the anode configured to create a discharge in a fuel located in a discharge space so as to generate a plasma, the discharge space including, in use, a substance configured to adjust radiation emission by the plasma so as to reduce a volume defined by the plasma, wherein the substance includes at least one of Ga, In, Bi or Al;
a pattern support configured to hold a patterning device, the patterning device configured to pattern the radiation to form a patterned beam of radiation;
a substrate support configured to support a substrate; and
a projection system configured to project the patterned beam of radiation onto the substrate.

28. The apparatus of claim 27, wherein the fuel includes at least one of Sn, Xe or Li.

29. The apparatus of claim 27, further comprising a fuel supply configured to supply the fuel to the discharge space.

30. The apparatus of claim 27, further comprising a supply configured to supply the substance in the discharge space.

31. The apparatus of claim 27, wherein the substance and the fuel are separately supplied to the discharge space.

32. The apparatus of claim 27, wherein the substance is part of a mixture including the fuel.

33. The apparatus of claim 32, wherein the mixture is solid or liquid.

34. The apparatus of claim 33, wherein the mixture is located on the cathode.

35. The apparatus of claim 27, wherein the substance is selected to increase the radiation emission in a pre-determined wavelength range.

36. The apparatus of claim 27, wherein the substance is configured to reduce a radial size of the plasma.

37. The apparatus of claim 27, further comprising a supply configured to supply both the fuel and the substance in the discharge space.

38. The apparatus of claim 27, wherein an etendue of the source substantially matches an etendue of the lithographic apparatus.

39. The apparatus of claim 27, wherein the patterning device includes a programmable mirror array.

* * * * *